(12) United States Patent
Bealkowski et al.

(10) Patent No.: US 6,295,591 B1
(45) Date of Patent: Sep. 25, 2001

(54) METHOD OF UPGRADING AND/OR SERVICING MEMORY WITHOUT INTERRUPTING THE OPERATION OF THE SYSTEM

(75) Inventors: Richard Bealkowski, Redmond, WA (US); Scott Douglas Clark, Rochester, MN (US); Sudhir Dhawan, Austin, TX (US); Robert Allen Drehmel, Goodhue, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/281,084

(22) Filed: Mar. 30, 1999

(51) Int. Cl.[7] .............................. G06F 12/00; G06F 13/00; H05K 10/00; H02K 3/05
(52) U.S. Cl. .............................. 711/165; 711/115; 711/2; 711/170; 714/2; 714/5; 714/6; 714/7
(58) Field of Search ..................................... 711/104, 105, 711/115, 170, 165, 2; 714/2, 5, 6, 7

(56) References Cited

U.S. PATENT DOCUMENTS

| | | | | |
|---|---|---|---|---|
| 4,093,985 | * | 6/1978 | Das ........................................ | 364/200 |
| 4,150,428 | * | 4/1979 | Inrig .................................. | 340/172.5 |
| 4,456,966 | * | 6/1984 | Bringol .................................. | 364/900 |
| 4,584,681 | * | 4/1986 | Singh ..................................... | 371/10 |
| 5,235,687 | * | 8/1993 | Bacot et al. ........................... | 395/425 |
| 5,742,613 | * | 4/1998 | MacDonald ......................... | 371/10.3 |
| 5,787,464 | * | 7/1998 | Yoshizawa ............................ | 711/115 |

* cited by examiner

Primary Examiner—Do Hyun Yoo
Assistant Examiner—Kimberly McLean
(74) Attorney, Agent, or Firm—Bracewell & Patterson, LLP

(57) ABSTRACT

A method of providing maintenance for a memory device of a computer system without interrupting operation of the computer system, by partially mirroring a primary memory array in a secondary memory array, wherein the secondary memory array has a different amount of available memory than the primary memory array. Values are copied from the primary memory array to the permanent storage device, allowing the primary memory array to quiesce and be serviced while using the secondary memory array to operate the computer system. Thereafter, the primary memory array is brought on-line, and the mirrored values are written back from the secondary memory array to the primary memory array. The memory service program itself may be embedded in the operating system. In an illustrative embodiment, the primary memory array is located on a first removable memory card, and the secondary memory array is located on a second removable memory card. The amount of memory available in the secondary memory array may be programmable.

11 Claims, 2 Drawing Sheets

METHOD OF UPGRADING AND/OR SERVICING MEMORY WITHOUT INTERRUPTING THE OPERATION OF THE SYSTEM

BACKGROUND OF THE INVENTION

1. Field of the Invention

The present invention generally relates to computer systems, and more specifically to a method of upgrading or servicing computer components, particularly system memory (RAM), without powering down the computer system or otherwise interrupting service.

2. Description of Related Art

Modern computing systems are often constructed from a number of processing units and a main memory, connected by a generalized interconnect. The basic structure of a conventional multi-processor computer system 10 is shown in FIG. 1. Computer system 10 has several processing units 12a, 12b, and 12c which are connected to various peripheral, or input/output (I/O) devices 14 (such as a display monitor, keyboard, and permanent storage device), memory device 16 (random-access memory or RAM) that is used by the processing units to carry out program instructions, and firmware 18 (read only memory) whose primary purpose is to seek out and load an operating system from one of the peripherals (usually the permanent memory device) whenever the computer is first turned on.

Processing units 12a–12c communicate with the peripheral devices, memory and firmware by various means, including a bus 20. Computer system 10 may have many additional components which are not shown, such as serial and parallel ports for connection to, e.g., modems or printers. Those skilled in the art will further appreciate that there are other components that might be used in conjunction with those shown in the block diagram of FIG. 1; for example, a display adapter might be used to control a video-display monitor, a memory controller can be used to access memory 16, etc. The computer can also have more than three processing units. In a symmetric multi-processor (SMP) computer, all of the processing units 12a–12c are generally identical, that is, they all use a common set or subset of instructions and protocols to operate, and generally have the same architecture.

Conventional computer systems often allow the user to add various components after delivery from the factory. For peripheral devices, this can be accomplished using an "expansion" bus, such as the Industry Standard Architecture (ISA) bus or the Peripheral Component Interconnect (PCI) bus. Another component that is commonly added by the user is main memory (16). This memory is often made up of a plurality of memory modules that can be added or removed as desired. The memory modules usually have memory chips in dual in-line packages, mounted on a single circuit board, and so are referred to as dual in-line memory modules (DIMMs).

DIMMs can be added to upgrade a system's memory, or to replace older modules that have become defective. Each DIMM has an edge with a plurality of contacts or pins (e.g., 72 pins), adapted to mate with an edge connector (socket or slot) mounted on a memory card or on the primary circuit board ("motherboard") of the computer system. The slot connectors for the memory modules are often arranged in two or more banks on the memory card. DIMMs are available in different sizes, not only with respect to physical size, but also with respect to the amount of memory that they provide. For example, DIMMs used with personal computers (PCs) often in sizes of 8 megabytes, 16 megabytes, 32 megabytes, 64 megabytes and 128 megabytes.

When a user desires to upgrade or service system memory, the computer must generally be powered down prior to addition or replacement of DIMMs. After the maintenance is performed, the computer is re-started, the basic input-output system (BIOS) residing in the firmware tests the memory, and makes the memory available to the operating system which is thereafter loaded by the firmware.

For many computer systems (particularly large servers used in a client-server network), there may be hundreds of users connected to it, and the down time required to perform a memory upgrade and service can be extremely expensive. Also, in systems which are used in mission-critical applications, it is highly desirable to be able to perform a memory upgrade and service operation without interrupting service operation.

One solution for uninterrupted performance during a memory upgrade or service is to provide two essentially identical memory cards, and mirror the memory on each card. This construction offers other advantages as well—data can be read from either card, so two memory reads can be processed simultaneously (in the case of memory writes, both memory cards need to be written). When a memory service or upgrade is required, the subject memory card can be quiesced and powered off. This card can then be removed, upgraded and/or serviced. The upgraded (or replacement) memory card is then plugged back into the system, and can be brought back on-line after running a routine that writes to the upgraded (or replacement) memory card the contents of the mirrored region by reading from the resident memory card in the system, so that the memory cards are again mirrored.

The foregoing solution can turn out to be very expensive, especially if the memory cards are populated with, e.g., gigabytes of memory (which is becoming common for high-performance servers). From one perspective, this construction effectively reduces available memory by half. It would, therefore, be desirable to provide a method of upgrading or servicing computer memory without requiring a powering down or interruption of the system, and which further did not require redundant memory modules that are so wasteful/expensive.

SUMMARY OF THE INVENTION

It is therefore one object of the present invention to provide an improved method of upgrading and servicing components of a computer system.

It is another object of the present invention to provide such a method that allows the main memory of the computer system to be upgraded or serviced, without interrupting system operation.

It is yet another object of the present invention to provide such a method that does not require mirroring the entire system memory.

The foregoing objects are achieved in a method of providing maintenance for a memory device of a computer system without interrupting operation of the computer system, generally comprising the steps of providing a partial mirror of a primary memory array in a secondary memory array wherein the secondary memory array has a different amount of available memory than the primary memory array, copying values from the primary memory array to a permanent storage device of the computer system, quiescing the primary memory array, thereafter or servicing the primary memory array while using the secondary memory array to operate the computer system, then bringing the primary memory array on-line, and writing the values back from the mirrored region of the resident memory array to the primary memory array. The essential elements of the operating system required to continue basic operation of the computer system are mirrored in the second memory array so as to be available during upgrade/service. The memory service program itself may be embedded in the operating system. In an illustrative embodiment, the primary memory array is located on a first removable memory card, and the secondary memory array is located on a second removable memory card. The amount of mirrored memory available in the secondary memory array may be programmable.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein:

DESCRIPTION OF AN ILLUSTRATIVE EMBODIMENT

Figure 1:
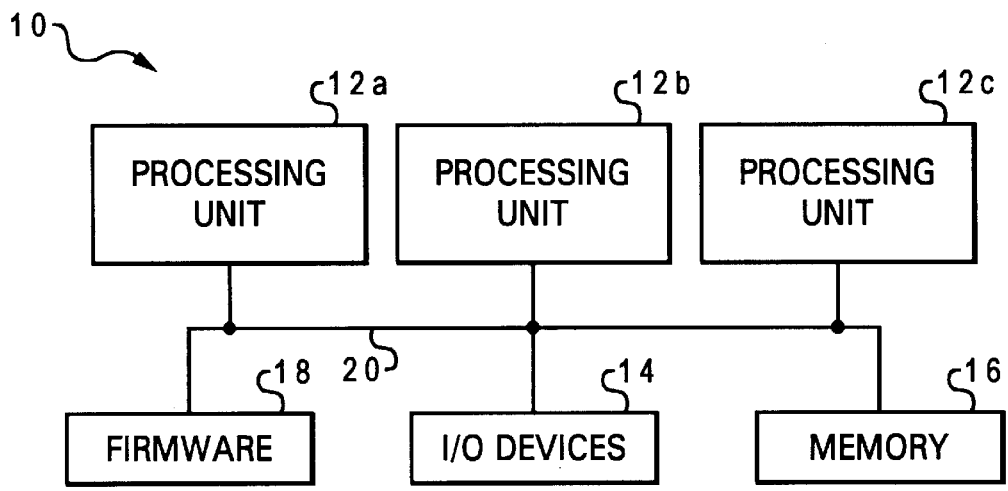
FIG. 1 is a block diagram of a prior-art multi-processor computer system.
Figure 2:
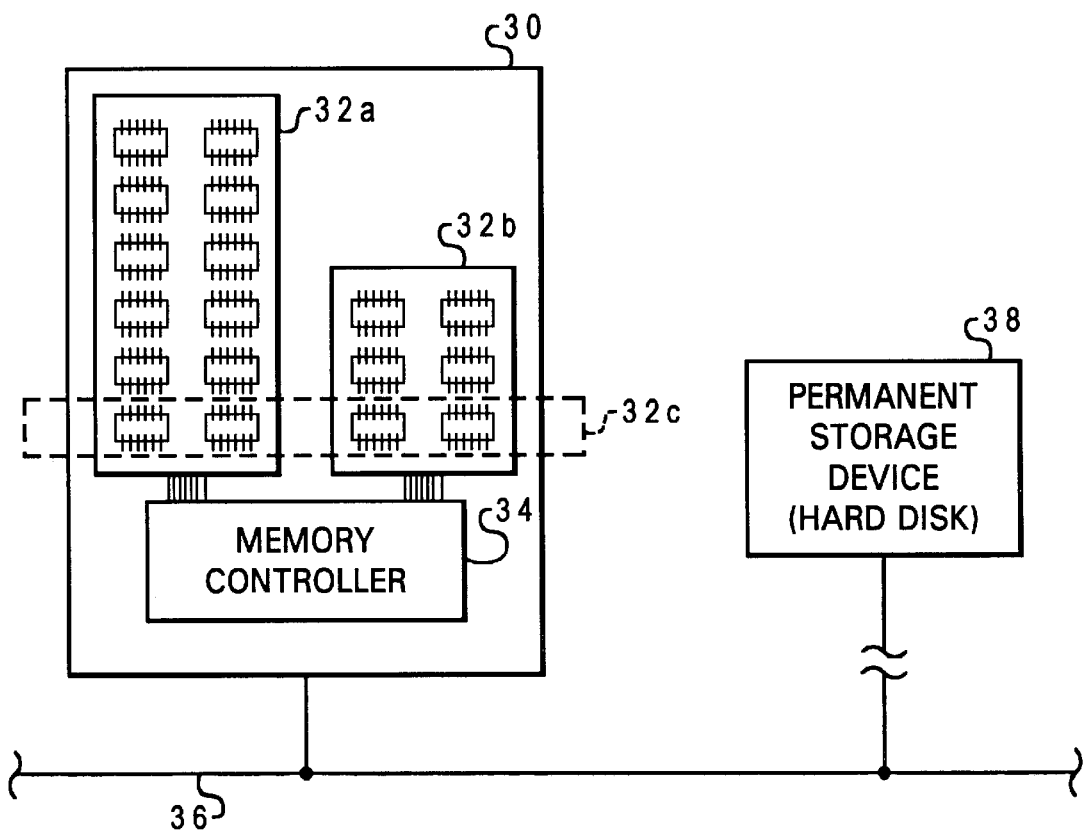
FIG. 2 is a block diagram illustrating a memory device for a computer system constructed in accordance with the present invention, to provide partial mirroring of memory and thereby allow memory upgrade or service without interrupting the computer's operation.

With reference now to the figures, and in particular with reference to FIG. 2, there is depicted one embodiment 30 of a memory device for a computer system, constructed in accordance with the present invention. Memory 30 is generally comprised of two memory arrays or cards 32a and 32b, and a memory controller 34. Each memory card 32a, 32b is connected to a generalized interconnect (system bus) 36 of the computer system, via memory controller 34. The system bus is connected to one or more processing units of the computer system (not shown), and to several peripheral devices, including a permanent storage device (e.g., hard disk) 38. Permanent storage device 38 may be connected indirectly to bus 36, via one or more expansion buses.

As shown in FIG. 2, one memory card (32a) has a large number of memory modules available to the system. The memory modules can be, e.g., dual in-line memory modules (DIMMs) that are individually removable from the memory card using conventional socket connectors that releasably retain a contact or pin edge of a DIMM in a slot of a connector. The invention is applicable to any sort of RAM, including static random-access memory (SRAM), dynamic random-access memory (DRAM), and synchronous dynamic random-access memory (SDRAM).

In this example, the other memory card (32b) has a smaller number of memory modules, and is used as a partial mirror of the values stored in the memory modules of the primary card (32a). Different amounts of mirroring may be provided. In an illustrative embodiment which is adapted for use with a high end server, memory card 32a provides two gigabytes of RAM memory, while memory card 32b provides one gigabyte for partial mirroring. This configuration is suitable for an exemplary system having eight PowerPC processing units (PowerPC is a trademark of International Business Machines Corp., assignee of the present invention). The mirrored region 32c may include only a portion of each memory card.

The computer system and, in particular, memory 30 are adapted to allow memory upgrading and servicing while the system is running, i.e., without powering down the computer or otherwise interrupting service. In this implementation, the operating system of the computer pages out the unmirrored portions of memory on card 32a to the permanent storage device before the memory upgrade/service is performed. Once the unmirrored portions have been stored on the hard disk, memory card 32a can be quiesced, powered off, unplugged and upgraded and/or serviced. After memory card 32a (or a replacement card) is plugged back into the controller connector and powered up, a routine is executed by the operating system that writes all locations of mirrored memory from memory card 32b to memory card 32a. The memory card can then be brought back on line. Existing operating systems, such as IBM's AIX operating system for servers, can be modified to allow the above-described partial memory mirroring. Power for the memory cards may be provided using the voltage supply described in U.S. patent application Ser. No. 09/28/826, which is hereby incorporated.

The amount of memory that is to be partially mirrored in card 32b may be programmable and determined at initial program load (IPL) time. The amount may be selected according to the desired level of performance during memory upgrade/service. A relatively small amount of memory may be provided if the system is to operate in a "barebones" mode wherein the operating system remains active, but very little service is provided to users or specific applications while the bulk of the memory remains cached. More memory may be used on card 32b to reduce such performance degradation during upgrade/service and make it less noticeable to any users. While FIG. 2 illustrates memory card 32b as having six memory modules, those skilled in the art will appreciate that the number of modules may be more or less.

Figure 3:
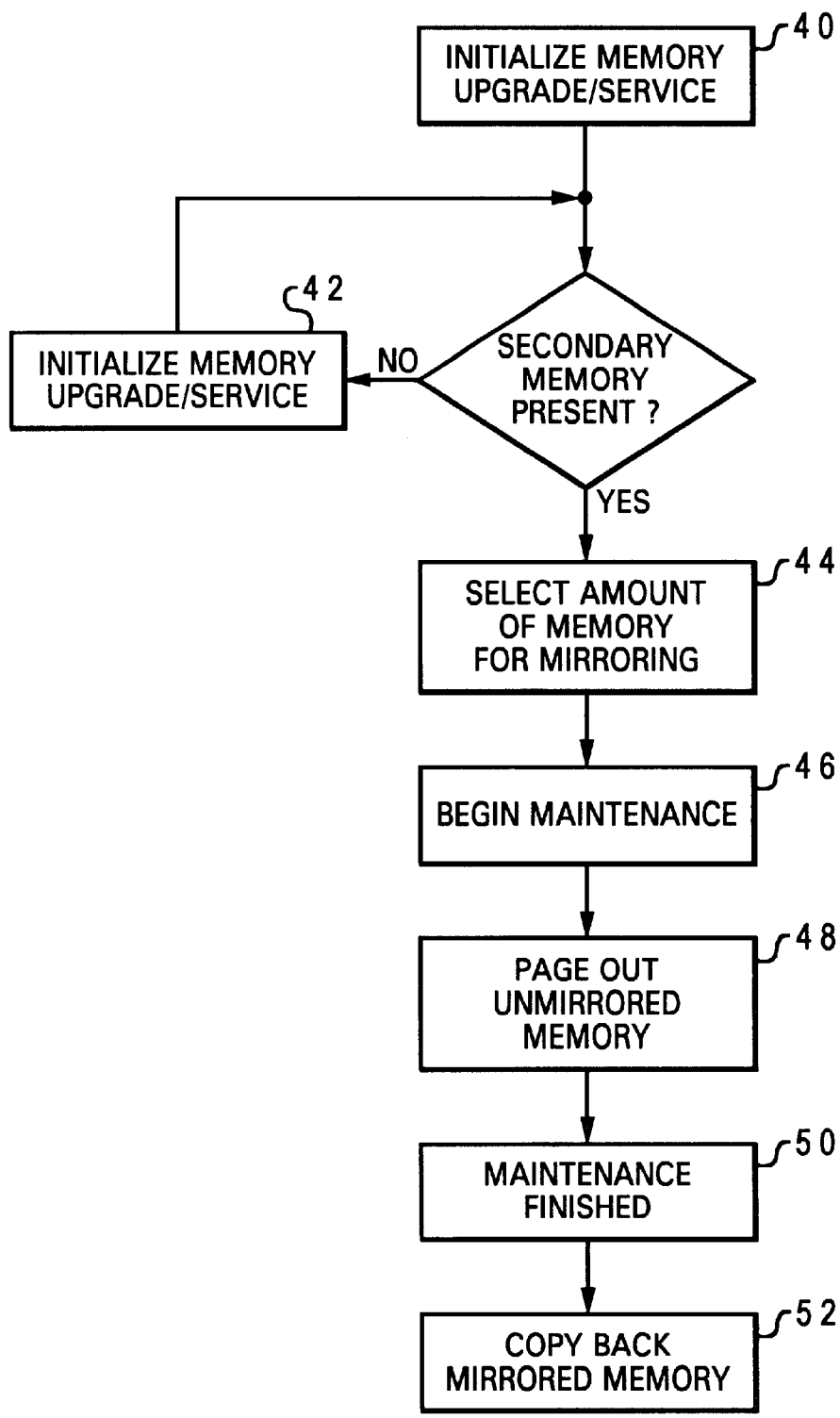
FIG. 3 is a flow chart illustrating the method of the present invention for providing memory upgrade or service.

The method of the present invention may be further understood with reference to the flow chart of FIG. 3. The process begins with a user (administrator) initializing the memory upgrade/service function embedded in the operating system (40). A secondary memory card must be installed for partial mirroring. If not, the user is prompted to install the secondary memory card (42). If partial mirroring has already been enabled, the amount of memory available for partial-mirroring will have been set. The user may, however, elect to alter the amount of memory mirrored (44). When the user is otherwise physically prepared to perform the maintenance, an appropriate command is selected (46) and the computer system enters the memory upgrade/service mode upon completion of copying the memory from the primary memory card to the permanent storage device (48). When maintenance is complete and the primary memory card is connected to the memory controller, the user signals the computer system, e.g., selects the "OK" or "finished" command of the upgrade/service program (50), and the mirrored memory is written back to the primary memory card (52). The upgrade/service program embedded in the operating system closes, and operation thereafter continues using both memory cards (mirrored data can be read from either card to allow limited simultaneous read operations).

By using only partial mirroring, but still providing for the retention of unmirrored data, the present invention allows memory upgrades without interruption, but at substantially less expense than would be required if the memory were fully mirrored. Allowing different amounts of memory for partial mirroring imparts further flexibility to the method.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. For example, while the foregoing description refers to a common memory device used by the computer system, the invention could also be adapted for non-uniform memory access (NUMA) systems. It is therefore contemplated that such modifications can be made without departing from the spirit or scope of the present invention as defined in the appended claims.

What is claimed is:

1. A method of providing maintenance for a memory device of a computer system without interrupting operation of the computer system, comprising the steps of:

storing a plurality of values in a primary memory array;

providing a partial mirror of the primary memory array in a secondary memory array, wherein the secondary memory array has less available memory than the primary memory array, in response to user initiation of a memory maintenance function;

copying unmirrored values from the primary memory array to a permanent storage device in response to user initiation of a memory maintenance function;

quiescing the primary memory array, after said copying step;

servicing the primary memory array, after said quiescing step, while using the secondary memory array to operate the computer system;

bringing the primary memory array on-line, after said servicing step; and writing the mirrored values back from the secondary memory array to the primary memory array and writing the unmirrored values from said permanent storage device to the primary memory array, after said bringing step.

2. The method of claim 1 wherein said providing step mirrors an operating system of the computer system in the secondary memory array.

3. The method of claim 1 wherein:

the primary memory array is located on a removable memory card; and said servicing step includes the step of removing the memory card from the computer system.

4. The method of claim 1 comprising the further step of embedding a memory service program in an operating system of the computer system, the memory service program carrying out said copying steps.

5. The method of claim 4 comprising the further step of loading the memory service program into one or more processing units of the computer system.

6. A computer system comprising:

one or more processing units for carrying out program instructions;

a permanent storage device;

a primary memory array coupled to said one or more processing units;

a secondary memory array having less available memory than the primary memory array, coupled to said one or more processing units; and program instructions, loaded in said primary memory array and at least partially mirrored in said secondary memory array, for (i) copying unmirrored values from said primary memory array to said permanent storage device, (ii) quiescing said primary memory array, after copying the unmirrored values, while using the secondary memory array to operate the computer system, (iii) bringing said primary memory array on-line after being quiesced and serviced, and (iv) writing the mirrored values back from said secondary memory array to said primary memory array such that a fully mirrored memory array is not required for memory service.

7. The computer system of claim 6 further comprising a memory controller coupling said primary and secondary memory arrays to said one or more processing units.

8. The computer system of claim 6 wherein said program instructions are embedded in an operating system loaded on the computer system.

9. The computer system of claim 6 wherein:

said primary memory array is located on a first removable memory card; and said secondary memory array is located on a second removable memory card.

10. A computer program product comprising:

a storage media adapted to be read by a computer system having one or more processing units for carrying out program instructions, a primary memory array coupled to said one or more processing units, and a secondary memory array having less available memory than the primary memory array, coupled to said one or more processing units; and program instructions located on said storage media, for (i) copying unmirrored values from said primary memory array to said permanent storage device, (ii) quiescing said primary memory array, after copying the unmirrored values, while using the secondary memory array to operate the computer system, (iii) bringing said primary memory array on-line after being quiesced and serviced, and (iv) writing the mirrored values back from said secondary memory array to said primary memory array such that a fully mirrored memory array is not required for memory service.

11. The computer program product of claim 10 wherein said program instructions are embedded in an operating system located on said storage media.

* * * * *